United States Patent
Polk, Jr. et al.

(10) Patent No.: US 7,103,820 B2
(45) Date of Patent: Sep. 5, 2006

(54) SYSTEM AND METHOD FOR INTERLEAVING FORWARD ERROR CORRECTION CODE WORDS ACROSS MULTIPLE COMMUNICATION CONNECTIONS

(75) Inventors: Charles E. Polk, Jr., Athens, AL (US); Clint S. Coleman, Huntsville, AL (US); Robert A. Barrett, Madison, AL (US)

(73) Assignee: Adtran, Inc., Huntsville, AL (US)

( * ) Notice: Subject to any disclaimer, the term of this patent is extended or adjusted under 35 U.S.C. 154(b) by 459 days.

(21) Appl. No.: 10/667,942

(22) Filed: Sep. 22, 2003

(65) Prior Publication Data

US 2005/0066249 A1 Mar. 24, 2005

(51) Int. Cl.
*G01R 31/28* (2006.01)

(52) U.S. Cl. .................................. 714/752; 714/786
(58) Field of Classification Search ................ 714/752, 714/702, 786
See application file for complete search history.

(56) References Cited

U.S. PATENT DOCUMENTS

| | | | | |
|---|---|---|---|---|
| 4,998,252 A | 3/1991 | Suzuki et al. | ................ | 714/756 |
| 5,737,337 A | 4/1998 | Voith et al. | ................ | 714/702 |
| 5,923,642 A | 7/1999 | Young | ........................ | 370/206 |
| 6,118,825 A | 9/2000 | Ikeda et al. | ................ | 375/259 |
| 6,278,716 B1 | 8/2001 | Rubenstein et al. | ........ | 370/432 |
| 6,347,075 B1 | 2/2002 | Barzegar et al. | ........... | 370/228 |
| 6,480,976 B1 | 11/2002 | Pan et al. | ................... | 714/701 |
| 6,522,731 B1 * | 2/2003 | Matsumoto | .............. | 379/93.08 |
| 6,647,070 B1 * | 11/2003 | Shalvi et al. | ............... | 375/285 |
| 6,683,855 B1 | 1/2004 | Bordogna et al. | .......... | 370/244 |
| 6,742,155 B1 * | 5/2004 | Bengough | ................... | 714/752 |
| 6,757,553 B1 * | 6/2004 | English | ................... | 455/562.1 |
| 6,829,741 B1 * | 12/2004 | Khansari et al. | ........... | 714/755 |
| 6,865,190 B1 * | 3/2005 | Abbas et al. | ............... | 370/471 |
| 6,922,806 B1 * | 7/2005 | Gibson et al. | ............. | 714/786 |
| 6,971,057 B1 * | 11/2005 | Delvaux et al. | ........... | 714/788 |

OTHER PUBLICATIONS

American National Standard for Telecommunications, ANSI TI 413-1998, *Network and Customer Installation Interfaces Asymmetric Digital Subscriber Line (ADSL) Metallic Interface*, Abstract and pp. 25-32.

Coleman, et al., "Data Communication System and Method for Selectively Implementing Forward Error Correction," filed Sep. 22, 2003.

* cited by examiner

*Primary Examiner*—Guy Lamarre
*Assistant Examiner*—Esaw T. Abraham
(74) *Attorney, Agent, or Firm*—Thomas, Kayden, Horstemeyer, & Risley, L.L.P.

(57) ABSTRACT

A forward error correction system comprises a forward error correction (FEC) module and a transmission module. The FEC module is configured to define a plurality of FEC code words, and the transmission module is configured to transmit the FEC code words to a remote receiving unit via a plurality of communication connections. The transmission module is further configured to ensure that characters of each of the FEC code words are transmitted across different ones of the communication connections.

20 Claims, 5 Drawing Sheets

|  | Col. 1 | Col. 2 | Col. 3 | Col. 4 | Col. 5 | Col. 6 | Col. 7 | Col. 8 |
|---|---|---|---|---|---|---|---|---|
| Row 1 | Char 1 | Char 2 | Char 3 | Char 4 | Char 5 | Char 6 | CS Char 7 | CS Char 8 |
| Row 2 | Char 9 | Char 10 | Char 11 | Char 12 | Char 13 | Char 14 | CS Char 15 | CS Char 16 |
| Row 3 | Char 17 | Char 18 | Char 19 | Char 20 | Char 21 | Char 22 | CS Char 23 | CS Char 24 |
| Row 4 | Char 25 | Char 26 | Char 27 | Char 28 | Char 29 | Char 30 | CS Char 31 | CS Char 32 |

SYSTEM AND METHOD FOR INTERLEAVING FORWARD ERROR CORRECTION CODE WORDS ACROSS MULTIPLE COMMUNICATION CONNECTIONS

RELATED ART

In conventional forward error correction (FEC) communication systems, data is often encoded into code words before being transmitted to a receiver at a remote premises. Each code word typically comprises a plurality of characters, and each character usually has the same bit length, although characters of differing bit lengths are also possible. In encoding data into a code word, an encoder typically appends, to the data, additional characters, sometimes collectively referred to as a "checksum." The checksum appended to the data characters within a particular code word comprises redundant information about the data characters, and this redundant information may be used to recover one or more data characters of the code word if part of the code word is corrupted during transmission.

In this regard, when a code word is transmitted along a transmission medium between a transmitter and a receiver, it is possible for impulse noise occurring on the transmission medium to corrupt only a small number of characters within a transmitted code word. Depending on the number of characters corrupted by the impulse noise, it is sometimes possible for the receiver to use the code word's checksum to recover the corrupted characters. In particular, the checksum may be used to recover corrupted characters within a code word as long as the number of corrupted characters is below some predefined threshold depending on the type of checksum that is appended to the code word. If the number of corrupted characters exceeds this predefined threshold, then recovery of the corrupted characters is usually impossible. Thus, it is generally desirable to minimize the number of characters that are corrupted during transmission of a particular code word.

Interleaving of code words across the same communication line is often employed by FEC communication systems in an effort to reduce the number of corrupted characters within the same code word. When a particular code word is interleaved with one or more other code words across the same communication line, each character of the particular code word is separated by one or more characters of other code words depending on the number of code words being interleaved. Thus, the number of characters within the particular code word that are corrupted by a single occurrence of impulse noise is reduced thereby increasing the probability that corrupted characters within the particular code word may be recovered at the receiver.

To further illustrate the effects of interleaving, assume a first code word defined by four characters $X_0$, $X_1$, $X_2$, and $X_3$ is to be interleaved with a second code word defined by four characters $Y_0$, $Y_1$, $Y_2$, and $Y_3$. In such an example, a transmitter may transmit, in an interleaved fashion, the foregoing characters in the following sequential order: $X_0$, $Y_0$, $X_1$, $Y_1$, $X_2$, $Y_2$, $X_3$, $Y_3$. Thus, a character of the second code word is transmitted between each character of the first code word. As a result, if an occurrence of impulse noise corrupts two successively transmitted characters (e.g., $X_1$, $Y_1$), then only one character from each code word is corrupted.

Note that if the first code word is instead transmitted in a non-interleaved fashion prior to the second code word, then it is possible for the aforementioned impulse noise occurrence to corrupt two characters of the same code word. Moreover, by interleaving the two code words across the same communication line, as described above, the effect of the impulse noise is spread to multiple code words thereby increasing the probability that the receiver will be able to recover the characters corrupted by the impulse noise. As a result, the robustness of a data communication system is generally increased if code words are interleaved prior to transmission.

Note that increasing the number of code words that are interleaved together prior to transmission has the effect of enabling the transmission to withstand impulse noise of longer durations. For example, if four code words are interleaved in a manner similar to the interleaving methodology described above, then it is possible for an occurrence of impulse noise to corrupt four consecutive characters without corrupting more than one character in any single code word. However, increasing the number of code words that are interleaved also may have the adverse effect of increasing the transmission latency of the code words. In this regard, if m code words are to be interleaved together, then a transmitter may wait to receive all m code words before commencing transmission of any one of the m code words. Thus, increasing the number of interleaved code words (i.e., increasing m) may introduce a greater transmission delay.

Moreover, techniques for increasing the robustness and reducing the transmission latency of an FEC communication system are generally desirable.

SUMMARY OF THE INVENTION

Generally, embodiments of the present invention provide a forward error correction (FEC) system and method for interleaving FEC code words across multiple communication connections.

A system in accordance with one embodiment of the present invention comprises a forward error correction (FEC) module and a transmission module. The FEC module is configured to define a plurality of FEC code words. The transmission module is configured to interleave the FEC code words across multiple communication connections such that characters of each of the plurality of FEC code words are transmitted across different ones of the communication connections, wherein each of the communication connections is communicatively coupled to a remote receiving unit.

A system in accordance with another embodiment of the present invention also comprises a forward error correction (FEC) module and a transmission module. The FEC module is configured to define a plurality of FEC code words, and the transmission module is configured to transmit the FEC code words to a remote receiving unit via a plurality of communication connections. The transmission module is further configured to ensure that characters of each of the FEC code words are transmitted across different ones of the communication connections.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

FIG. 6 is a block diagram illustrating an exemplary buffer of the FEC module depicted in FIG. 1.

DETAILED DESCRIPTION

The present invention generally relates to a forward error correction (FEC) communication system and method for interleaving FEC code words across multiple communication lines or connections. By interleaving each of a plurality of FEC code words across multiple communication lines or connections, it is possible for a receiving device to fully recover the FEC code words even if a relatively large number of errors occurs on one of the communication lines or connections. Thus, a more robust FEC communication system and method are realized.

Figures 1, 2:
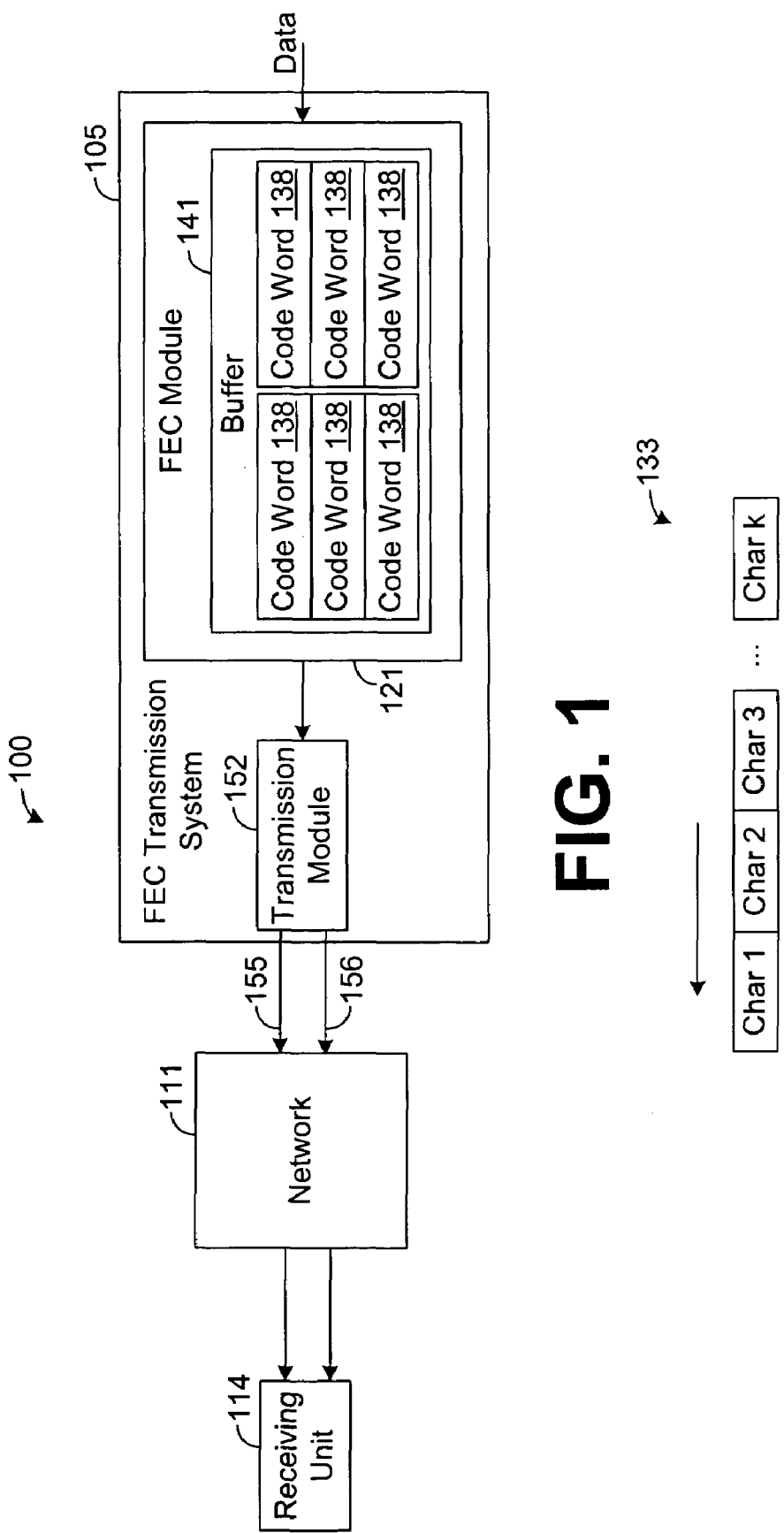
FIG. 1 is a block diagram illustrating an exemplary FEC communication system.
FIG. 2 is a block diagram illustrating an exemplary sequence of data characters received by an FEC transmission system depicted in FIG. 1.

FIG. 1 depicts an FEC communication system 100 in accordance with an exemplary embodiment of the present invention. The system 100 comprises an FEC transmission system 105 that communicates data through a network 111 to a receiving unit 114 that is remotely located from the transmission system 105. In this regard, the FEC transmission system 105 comprises an FEC module 121 that receives blocks of data to be communicated to the receiving unit 114. Such data may be received from a computer (not shown), a facsimile ("fax") machine (not shown), or any other device or component capable of producing data. As shown by FIG. 2, each data block 133 comprises k characters, where k is any positive integer value. Note that each character of a data block 133 may comprise any number of bits.

Figure 3:
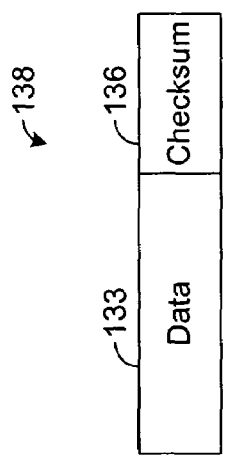
FIG. 3 is a block diagram illustrating a code word formed by an FEC module depicted in FIG. 1.
Figure 4:
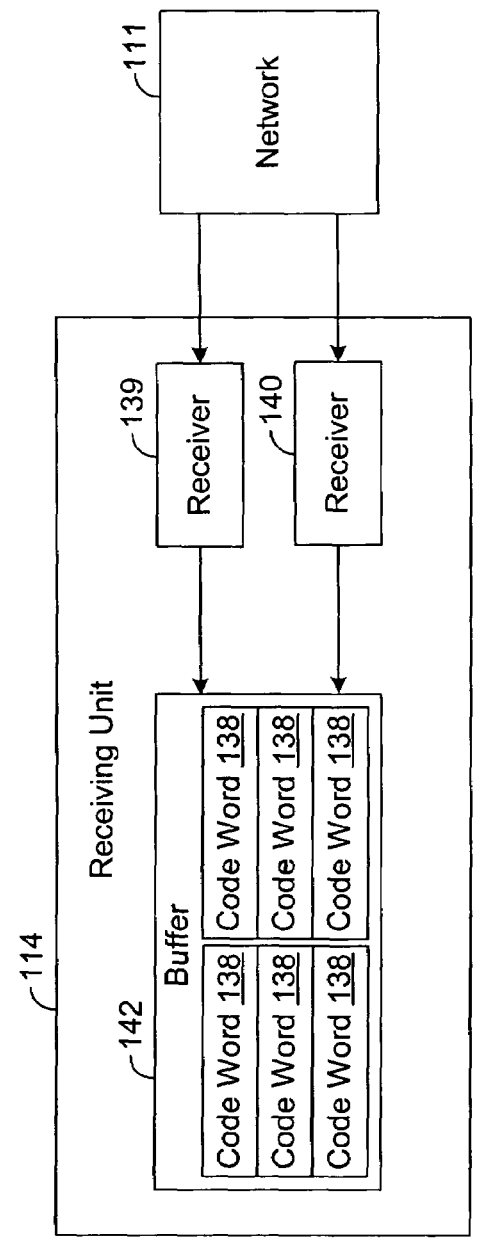
FIG. 4 is a block diagram illustrating an exemplary receiving unit for receiving code word characters transmitted by the FEC transmission system depicted in FIG. 1

For each block 133, the FEC module 121 defines a checksum block 136 and appends the checksum block 136 to the data block 133 to form a code word 138, as shown by FIG. 3. The checksum block 136 is based on the data block 133 to which the checksum block 136 is appended, and the checksum block 136 defines sufficient information for enabling the receiving unit 114 (FIG. 1) to recover at least one corrupted character of the data block 133 via known or future-developed forward error correction techniques.

Referring to FIG. 1, the FEC module 121 temporarily stores each code word 138 into a buffer 141, and a transmission module 152 reads the code words 138 from the buffer 141 and transmits the code words 138 over one or more communication connections that are communicatively coupled to the receiving unit 114. In the embodiment depicted by FIG. 1, the transmission module 152 transmits the code words 138 over two connections 155 and 156, which are coupled to the receiving unit 114 through the network 111. However, in other embodiments, the transmission module 152 may transmit the code words 138 over other numbers of communication connections. Each of the connections 155 and 156 may be digital subscriber line (e.g., ADSL, HDSL, etc.), an ISDN line, a T-1 line, or any other type of transmission medium used to communicate data over large distances.

In a preferred embodiment, the transmission module 152 interleaves the code word characters that are transmitted across the same communication connection. In this regard, the transmission module 152 transmits code word characters across the same connection 155 or 156 such that each character of the same code word 138 is separated by at least one character from another code word 138. For example, if the transmission module 152 interleaves four code words 138, then the transmission module 152 preferably successively transmits across the same connections 155 or 156 a character from each of the code words 138 before transmitting a second character from any of the four code words 138. By interleaving the code word characters across the same connection 155 or 156 in this way, the system 100 is better able to withstand impulse noise occurring along the connection 155 or 156.

For example, by interleaving the code word characters, as described above, a single occurrence of impulse noise may corrupt up to four consecutively transmitted characters without corrupting two characters of the same code word 138. Thus, the number of characters corrupted from the same code word 138 due to a single occurrence of impulse noise will be lower, due to the interleaving, thereby increasing the probability that the receiving unit 114 will be able to use the code word's checksum block 136 to recover the corrupted characters. Commonly-assigned U.S. patent application Ser. No. 10/626,022, entitled "System and Method for Interleaving and Transmitting Forward Error Correction Code Words," which is incorporated herein by reference, describes techniques that may be used to interleave the code words 138 across each of the communication connections 155 and 156.

In addition to the interleaving described above, the transmission module 152 preferably also interleaves code words 138 across multiple communication connections. In this regard, the transmission module 152 ensures that different characters of the same word 138 are transmitted across different communication connections 155 and 156. Therefore, if a significant number of errors occurs on one of the communication connections 155 or 156 during the transmission of a code word 138, the receiving unit 114 may successfully receive a sufficient number of characters to recover the corrupted characters if there are relatively few errors occurring on the other communication connection 155 or 156.

As an example, assume that a code word 138 is comprised of sixteen characters and that the code word 138 is transmitted to the receiving unit 114 by the FEC transmission system 105 using FEC techniques that enable full recovery of the code word 138 if the number of corrupted characters is less than three (3). Further assume that, during the transmission of code word 138, noise on communication connection 155, on average, corrupts approximately twenty-five (25) percent of the characters from each code word being transmitted across it. If the entire code word 138 is transmitted across the communication connection 155, then it is likely that four characters of the code word 138 would be corrupted. In this case, the receiving unit 114 is unable to fully recover the code word 138 since the maximum number of allowable corrupted characters (i.e., three in the instant example) has been exceeded.

However, assume that, during the same time period, noise on communication connection 156, on average, corrupts approximately ten (10) percent of the characters from each code word 138 being transmitted across it. If the aforementioned code word 138 is interleaved across both connections 155 and 156, instead of being transmitted across the single connection 155, then it is likely that the receiving unit 114 will successfully receive a sufficient number of characters to fully recover the code word 138.

For example, assume that the code word 138 is interleaved across the connections 155 and 156 such that eight characters of the code word 138 are transmitted across connection 155 and the remaining eight characters are transmitted across connection 156. In such an example, it is likely that two characters of the code word 138 will be corrupted by communication connection 155, and it is likely that one character of the code word 138 will be corrupted by communication connection 156. Thus, in this example, it is likely that only three characters of the code word 138 will be corrupted during the transmission of the code word 138. In such a case, the receiving unit 114 is able to fully recover the transmitted code word 138.

Figure 5:
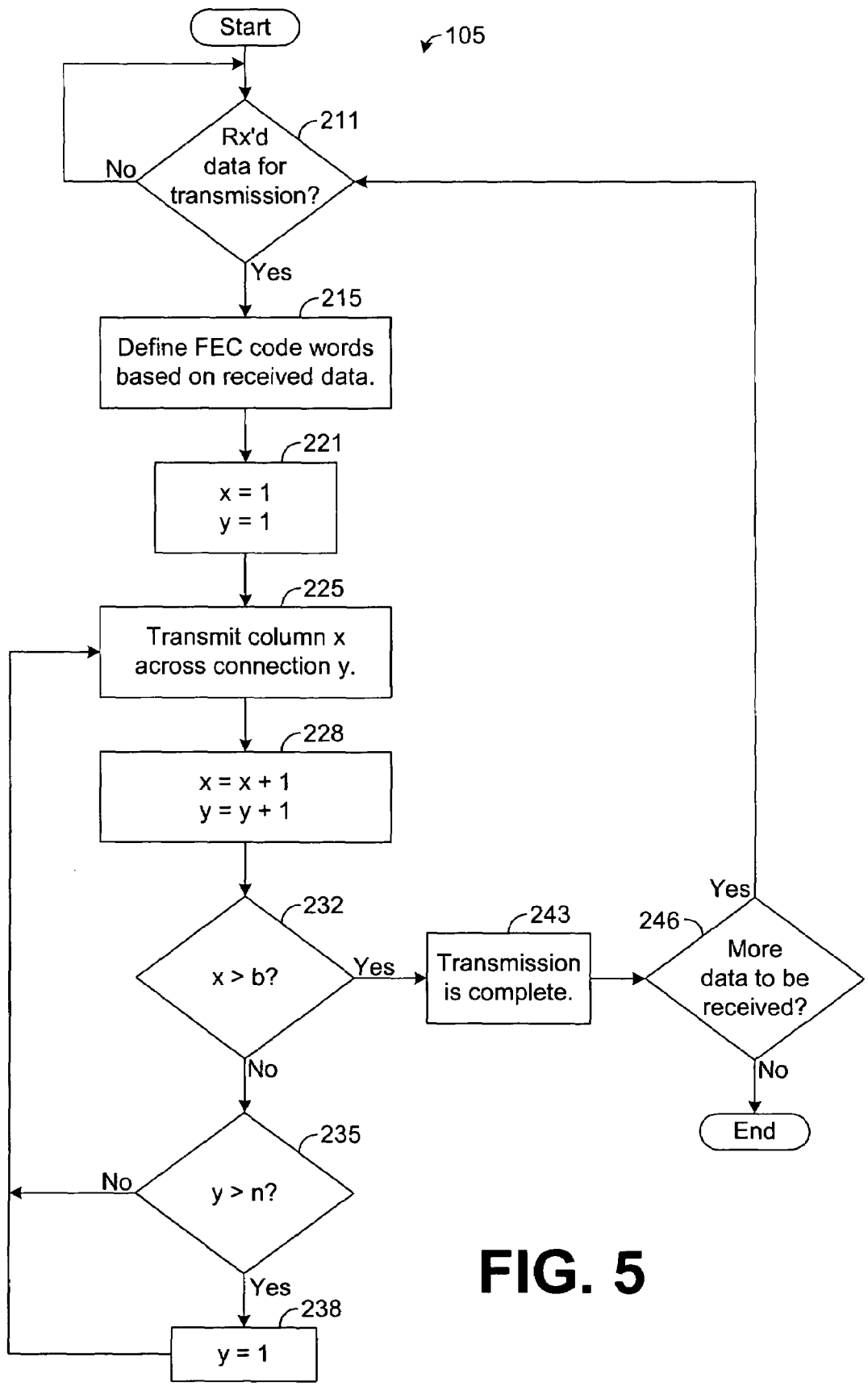
FIG. 5 is a flow chart illustrating an exemplary architecture and functionality of the FEC transmission system depicted in FIG. 1.

The receiving unit 114 preferably receives and recovers the code words 138 transmitted by the transmission module 152. In this regard, the characters transmitted by the transmission module 152 pass through network 111, which routes the characters to the receiving unit 114. As shown by FIG. 5, the receiving unit 114 comprises a receiver for each stream of code word characters transmitted from the transmission module 152. For example, in the embodiment depicted by FIG. 1 where the transmission module 152 transmits code word characters across two connections 155 and 156, the receiving unit 114 preferably comprises two receivers 139 and 140, although the receiving unit 114 may comprise other numbers of receivers, if desired. Receiver 139 receives the data characters transmitted across connection 155, and receiver 140 receives the data characters transmitted across connection 156.

The receivers 139 and 140 preferably store the received characters in a buffer 142. In a preferred embodiment, the receivers 139 and 140 store the characters from the same code word 138 in contiguous memory thereby recreating the FEC code words 138 transmitted from the FEC transmission system 105. Further, employing FEC recovery techniques, the receiving unit 114 preferably recovers code word characters that have been corrupted during transmission.

Moreover, by interleaving the code words 138 across multiple communication connections 155 and 156, as described above, the robustness of the system 100 is generally increased. Further, this increase in robustness may be achieved without substantially increasing the transmission latency of the FEC transmission system 105.

To help maximize the robustness of the system 100, the transmission module 152 preferably ensures that approximately the same number of characters of each code word 138 is transmitted across each communication connection. In other words, if there are n number of communication connections that may be used by the transmission module 152 to transmit a code word 138, then the transmission module 152 preferably ensures that approximately m/n number of characters are transmitted across each of the n communication connections, where m is the number of characters in the code word 138. However, if it is determined that a particular communication connection has a relatively high data rate and/or a relatively low error rate, then it may be desirable to use the particular communication connection to transmit a higher percentage of the code word characters.

It should be noted that there are a variety of techniques that may be employed to ensure that different characters of the same code word 138 are transmitted by the transmission module 152 across different communication connections 155 and 156. For illustrative purposes, exemplary techniques for interleaving code words 138 across multiple communication connections 155 and 156 will be described in more detail hereafter. However, it should be apparent to one of ordinary skill in the art that additional techniques, not specifically described herein, may alternatively be employed to ensure that the code words 138 are interleaved across multiple communication connections.

In one exemplary embodiment, the buffer 141 (FIG. 1) is comprised of rows and columns of memory. Each code word 138 to be interleaved together is stored in a different row of the buffer 141, and each character of the same code word 138 is stored in a different column of the buffer 141. The transmission module 152 reads each column of the buffer 141 and transmits the characters from the same column across the same connection 155 or 156. Further, the transmission module 152 interleaves the columns across the different communication connections 155 and 156 such that each communication connection 155 and 156 transmits different buffer columns. As a result, the code words 141 are interleaved across multiple communication connections and, for each communication connection, are transmitted in an interleaved fashion.

FIG. 5 depicts an exemplary process that may be used to implement the foregoing. In this regard, assume that the FEC module 121, in blocks 211 and 215, receives data to be transmitted to the receiving unit 114 and, based on this data, defines four FEC code words 138 that are to be interleaved together when transmitted to the receiving unit 114. Assume that each code word 138 comprises eight total characters, six data characters and two checksum characters. As shown by FIG. 6, the four code words 138 are preferably stored in different rows of the buffer 141. In this regard, a first code word 138, comprising data characters 1–6 and checksum (CS) characters 7 and 8, is stored in row 1 of the buffer 141. Further, a second code word 138, comprising data characters 9–14 and checksum (CS) characters 15 and 16, is stored in row 2 of the buffer 141, and a third code word 138, comprising data characters 17–22 and checksum (CS) characters 23 and 24, is stored in row 3 of the buffer 141. Finally, a fourth code word 138, comprising data characters 25–30 and checksum (CS) characters 31 and 32, is stored in row 4 of the buffer 141.

In block 221 of FIG. 5, the transmission module 152 initializes a variable x and a variable y to a value of one (1). In this example, x corresponds to the columns of the buffer 141 and y corresponds to the communication connections 155 and 156 that are used to transmit the code words 138 stored in the buffer 141, as will be described in more detail hereafter. In the instant example, assume that y identifies communication connection 155 when it has a value of one (1) and y identifies communication connection 156 when it has a value of two (2). In block 225, the transmission module 152 transmits the column identified by x across the connection identified by y. In the instant example where x and y both have a value of one (1), the transmission module 152 transmits column 1 across communication connection 155. Thus, the transmission module 152 successively transmits characters 1, 9, 17, and 25 across communication connection 155.

In block 228, the transmission module 152 increments x and y. In block 232, the transmission module 152 compares x to a variable b, where b represents the total number of buffer columns used to store the code words 138. In the instant example, b equals eight (8) since each code word 138 has eight (8) characters. If x is not greater than b, then there are additional buffer columns to be transmitted before the transmission of the code words 138 is complete. In the instant example, x is less than b, and the transmission module 152 proceeds to block 235 and compares y to n, where n represents the total number of communication connections 155 and 156 that the transmission module 152 may use to transmit the code word characters to the receiving unit 114. In the instant example, there are only two such communication connections 155 and 156, and n is therefore equal to two (2). Since y is not greater than n, the transmission module 152 proceeds to block 225 and transmits the buffer column identified by x across the communication connection identified by y. In the instant example, the transmission module 152 successively transmits column 2 across communication connection 156. Thus, the transmission module 152 transmits characters 2, 10, 18, and 26, across communication connection 156.

Then, the transmission module 152 increments x and y in block 228 and respectively compares x and y to b and n in blocks 232 and 235. A "yes" determination is made in block 235, and the transmission module 152 re-initializes y to a value of one (1) in block 238. Therefore, the next buffer column transmitted by the transmission module 152 in the next occurrence of block 225 will be transmitted across communication connection 155.

The aforedescribed process of transmitting the code word characters on a column-by-column basis in an interleaved fashion across communication connections 155 and 156 is repeated until all of the characters have been transmitted by the transmission module 152. Once this occurs, the transmission of the code words 138 previously defined in block 215 is complete, as shown by block 243. As shown by block 246, the process depicted by FIG. 5 may be repeated if additional data to be transmitted to the receiving unit 114 is received by the FEC module 121. If no such additional data is received, then the process depicted by FIG. 5 ends.

Figures 7, 8:
FIG. 7 is a block diagram illustrating a sequence of code word characters transmitted from the buffer of FIG. 6 according to the flow chart depicted by FIG. 5.
FIG. 8 is a block diagram illustrating another sequence of code word characters transmitted from the buffer of FIG. 6 according to the flow chart depicted by FIG. 5.

By implementing the process depicted by FIG. 5 to transmit code word characters to the receiving unit 114, the code word characters are transmitted in an interleaved fashion on each communication connection 155 and 156. Also, the code word characters are interleaved across the multiple communication connections 155 and 156. In this regard, FIGS. 7 and 8 depict the order in which code word characters are respectively transmitted across communication connections 155 and 156 according to the process depicted by FIG. 5. In particular, as shown by FIG. 7, the transmission module 152 successively transmits characters 1, 9, 17, 25, 3, 11, 19, 27, 5, 13, 21, 29, 7, 15, 23, and 31 across communication connection 155. Note that characters from the same code word 138 (i.e., the same buffer row) are separated by three characters from other code words 138 (i.e., from other buffer rows). Thus, a single occurrence of impulse noise on communication connection 155 can corrupt up to four consecutively transmitted characters without corrupting two characters from the same code word 138.

As shown by FIG. 8, the transmission module 152 successively transmits characters 2, 10, 18, 26, 4, 12, 20, 28, 6, 14, 22, 30, 8, 16, 24, and 32 across communication connection 156. Similar to the characters transmitted across connection 155, the characters from the same code word 138 (i.e., the same buffer row) transmitted across connection 156 are separated by three characters from other code words 138 (i.e., from other buffer rows). Thus, a single occurrence of impulse noise on communication connection 156 can corrupt up to four consecutively transmitted characters without corrupting two characters from the same code word 138.

Furthermore, as shown by FIGS. 7 and 8, half of the characters of each code word 138 are transmitted across connection 155, and the other half of the code word characters are transmitted across connection 156. Thus, even if noise on connection 155 corrupts a relatively high number of characters from one of the code words 138, it is possible that a relatively low number of characters from the same code word 138 are corrupted by noise on connection 156. Thus, due primarily to the relatively high number of characters successfully communicated over connection 156, it is possible for the receiving unit 114 to receive a sufficient number of characters to fully recover the code word 138. Indeed, interleaving the code words 138 across the multiple communication connections 155 and 156 helps to enhance the robustness of the FEC communication system 100.

It should be noted that, to reduce transmission latency, it is possible for the transmission module 152 to simultaneously transmit code word characters across multiple communication connections 155 and 156. In this regard, while the transmission module 152 is reading a buffer column and transmitting this column over communication connection 155, the transmission module 152 may simultaneously be reading another buffer column and transmitting this other buffer column over communication connection 156. In other words, it is possible to read and transmit buffer columns in parallel.

The process depicted by FIG. 5 has been described hereinabove as interleaving FEC code words 138 across two communication connections 155 and 156. However, as previously set forth above, it is possible for other numbers of communication connections to be employed in other embodiments. The same process depicted by FIG. 5 may be employed to interleave code words 138 across any number of communication connections.

Furthermore, to optimize the communication occurring between the transmission system 105 and the receiving unit 114, it may be desirable to dynamically change the number of communication connections used for such communication and to selectively enable and disable the FEC scheme implemented by the FEC module 121. Commonly-assigned U.S. Patent Application (attorney docket no. 710101-1180), entitled "Data Communication System and Method for Selectively Implementing Forward Error Correction," and filed concurrently herewith, which is incorporated herein by reference, describes techniques that may be employed to improve communication between the transmission system 105 and the receiving unit 114.

The invention claimed is:

1. A forward error correction communication system, comprising:
   a forward error correction (FEC) module configured to define a plurality of FEC code words, each of the FEC code words having a plurality characters and each of the characters having a plurality of bits; and
   a transmission module configured to interleave the FEC code words across multiple communication connections such that, for each respective FEC code word, characters of said each respective FEC code word are transmitted across multiple ones of the communication connections and such that characters of said each respective FEC code word that are transmitted over the same communication connection are separated by at least one character of another of the FEC code words but bits of the same character of said each respective FEC code word are successively transmitted over the same communication connection without any intervening bits from other characters, wherein each of the communication connections is communicatively coupled to a remote receiving unit.

2. The system of claim 1, wherein the transmission module is configured to ensure that m/n characters of at least one of the code words are transmitted across each of the communication connections, wherein m corresponds to a total number of characters for the at least one code word and n corresponds to a total number of the communication connections.

3. The system of claim 1, wherein each of the communication connections is a digital subscriber line.

4. The system of claim 1, wherein each of the communication connections couples the transmission module to a network.

5. The system of claim 1, further comprising a network coupled to each of the communication connections, the network configured to route the FEC code words from the communication connections to the remote receiving unit.

6. The system of claim 1, wherein all of the bits for at least one character of the FEC code words are transmitted across a single one of the communication connections.

7. A forward error correction communication system, comprising:
    a forward error correction (FEC) module configured to define a plurality of FEC code words, each of the FEC code words having a plurality of characters and each of the characters having a plurality of bits, the plurality of FEC code words including a first FEC code word and a second FEC code word; and
    a transmission module configured to transmit the FEC code words to a remote receiving unit via a plurality of communication connections, the transmission module configured to ensure that characters of the first FEC code word are transmitted across multiple ones of the communication connections and that characters of the second FEC code word are transmitted across multiple ones of the communication connections, the transmission module configured to ensure that a first character from the first FEC code word is separated from a second character of the first FEC code word by at least a character of the second FEC code word when the first and second characters are transmitted over one of the communication connections, said transmission module further configured to transmit the first FEC code word such that bits of the first character are successively transmitted over the one communication connection without any intervening bits from other characters.

8. The system of claim 7, wherein the transmission module is configured to ensure that m/n characters of at least one of the code words are transmitted across each of the communication connections, wherein m corresponds to a total number of characters for the at least one code word and n corresponds to a total number of the communication connections.

9. The system of claim 7, wherein each of the communication connections is a digital subscriber line.

10. The system of claim 7, wherein each of the communication connections couples the transmission module to a network.

11. The system of claim 7, wherein all of the bits of the first and second characters are transmitted across the one communication connection.

12. A forward error correction communication system comprising:
    memory for storing a plurality of forward error correction (FEC) code words, each of the FEC code words having a plurality of characters and each of the characters having a plurality of bits; and
    means for transmitting the FEC code words to a receiving unit via a plurality of communication connections that are communicatively coupled to the receiving unit, the transmitting means configured to ensure that, for each respective FEC code word, characters of said each respective FEC code word are transmitted across multiple ones of the communication connections, the transmitting means configured to ensure that characters of said each respective FEC code word that are transmitted along the same communication connection are interleaved with characters from at least one other FEC code word, the transmitting means further configured to ensure that, for each respective character of the FEC code words, bits of said each respective character are not separated by bits of other characters when transmitted across the communication connections.

13. A method for communicating forward error correction code words, comprising the steps of:
    transmitting a plurality of forward error correction (FEC) code words across a plurality of communication connections to a remote receiving unit, each of the FEC code words having a plurality of characters and each of the characters having a plurality of bits; and
    for each respective FEC code word, ensuring that characters of said each respective FEC code word are transmitted across multiple ones of the communication connections via the transmitting step and ensuring that characters of said each respective FEC code word that are transmitted along the same communication connection are interleaved with characters from at least one other FEC code word;
    wherein the transmitting step comprises the step of, for each respective character of the FEC code words, successively transmitting bits of said each respective character such that said bits are not separated by bits of other characters.

14. The method of claim 13, wherein the ensuring step comprises the step of ensuring that m/n characters of at least one of the code words are transmitted across each of the communication connections, wherein m corresponds to a total number of characters for the at least one code word and n corresponds to a total number of the communication connections.

15. The method of claim 13, wherein each of the communication connections is a digital subscriber line.

16. The method of claim 13, wherein all of the bits for at least one character of the FEC code words are transmitted across a single one of the communication connections.

17. A method for communicating forward error correction code words, comprising the steps of:
    defining a plurality of forward error correction (FEC) code words, each of the FEC code words having a plurality of characters and each of the characters having a plurality of bits, the plurality of FEC code words including a first FEC code word and a second FEC code word; and
    interleaving the plurality of FEC code words across a plurality of communication connections such that characters of the first code word are transmitted across multiple ones of the communication connections and such that characters of the first FEC code word are separated by characters from the second FEC code word but bits of each respective character of the first FEC code word are not separated by bits of other characters.

18. The method of claim 17, wherein the interleaving step comprises the step of ensuring that m/n characters of at least one of the code words are transmitted across each of the communication connections, wherein m corresponds to a total number of characters for the at least one code word and n corresponds to a total number of the communication connections.

19. The method of claim 17, wherein each of the communication connections is a digital subscriber line.

20. The method of claim 17, wherein all of the bits of at least one character of the first FEC code word are transmitted across a single one of the communication connections.

* * * * *